(12) United States Patent
Kaufmann et al.

(10) Patent No.: US 7,834,449 B2
(45) Date of Patent: Nov. 16, 2010

(54) HIGHLY RELIABLE LOW COST STRUCTURE FOR WAFER-LEVEL BALL GRID ARRAY PACKAGING

(75) Inventors: Matthew V. Kaufmann, Morgan Hill, CA (US); Teck Yang Tan, Singapore (SG)

(73) Assignee: Broadcom Corporation, Irvine, CA (US)

(*) Notice: Subject to any disclaimer, the term of this patent is extended or adjusted under 35 U.S.C. 154(b) by 346 days.

(21) Appl. No.: 11/741,804

(22) Filed: Apr. 30, 2007

(65) Prior Publication Data

US 2008/0265408 A1  Oct. 30, 2008

(51) Int. Cl.
*H01L 23/34* (2006.01)

(52) U.S. Cl. .................. 257/723; 257/737; 257/738; 257/E23.079

(58) Field of Classification Search ............ 257/723, 257/737, 738, E23.079
See application file for complete search history.

(56) References Cited

U.S. PATENT DOCUMENTS

| | | | |
|---|---|---|---|
| 5,442,234 A | 8/1995 | Liang | |
| 5,818,105 A | 10/1998 | Kouda | |
| 6,154,366 A | 11/2000 | Ma et al. | |
| 6,271,469 B1 | 8/2001 | Ma et al. | |
| 6,617,674 B2* | 9/2003 | Becker et al. | 257/678 |
| 6,709,898 B1 | 3/2004 | Ma et al. | |
| 6,734,534 B1 | 5/2004 | Vu et al. | |
| 6,750,397 B2 | 6/2004 | Ou et al. | |
| 6,867,122 B2* | 3/2005 | Weng | 438/614 |
| 6,946,325 B2 | 9/2005 | Yean et al. | |
| 6,965,160 B2 | 11/2005 | Cobbley et al. | |
| 7,002,245 B2 | 2/2006 | Huang et al. | |
| 7,170,152 B2 | 1/2007 | Huang et al. | |
| 7,268,012 B2 | 9/2007 | Jiang et al. | |
| 7,453,148 B2 | 11/2008 | Yang et al. | |
| 2003/0153172 A1* | 8/2003 | Yajima et al. | 438/612 |
| 2006/0264021 A1 | 11/2006 | Farahani et al. | |
| 2008/0182401 A1* | 7/2008 | Ke et al. | 438/614 |
| 2009/0039508 A1 | 2/2009 | Kaufmann | |

FOREIGN PATENT DOCUMENTS

| | | |
|---|---|---|
| KR | 101998703571 | 11/1998 |
| WO | 9631905 A1 | 10/1996 |

* cited by examiner

*Primary Examiner*—Tuan N. Quach
(74) *Attorney, Agent, or Firm*—Fiala & Weaver P.L.L.C.

(57) ABSTRACT

Methods, systems, and apparatuses for wafer-level integrated circuit (IC) packages are described. An IC package includes an IC chip, an insulating layer on the IC chip, a plurality of vias, a plurality of routing interconnects, and a plurality of bump interconnects. The IC chip has a plurality of terminals configured in an array on a surface of the IC chip. A plurality of vias through the insulating layer provide access to the plurality of terminals. Each of the plurality of routing interconnects has a first portion and a second portion. The first portion of each routing interconnect is in contact with a respective terminal of the plurality of terminals though a respective via, and the second portion of each routing interconnect extends over the insulating layer. Each bump interconnect of the plurality of bump interconnects is connected to the second portion of a respective routing interconnect of the plurality of routing interconnects.

25 Claims, 14 Drawing Sheets

HIGHLY RELIABLE LOW COST STRUCTURE FOR WAFER-LEVEL BALL GRID ARRAY PACKAGING

BACKGROUND OF THE INVENTION

1. Field of the Invention

The present invention relates to integrated circuit packaging technology, and more particularly to wafer-level ball grid array packages.

2. Background Art

Integrated circuit (IC) chips or dies are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

An advanced type of BGA package is a wafer-level BGA package. Wafer-level BGA packages have several names in industry, including wafer level chip scale packages (WLCSP), among others. In a wafer-level BGA package, the solder balls are mounted directly to the IC chip when the IC chip has not yet been singulated from its fabrication wafer. Wafer-level BGA packages can therefore be made very small, with high pin out, relative to other IC package types including traditional BGA packages.

A current move to tighter fabrication tolerances, such as 65 nm, with a continuing need to meet strict customer reliability requirements and ongoing cost pressures, is causing difficulties in implementing wafer-level BGA package technology. During operating conditions or reliability assessment testing, external stresses are applied to the wafer-level BGA package. These stresses are transferred to the package through a solder interconnect. For wafer-level packaging, two polymer layers in the package are typically required to act as a stress buffer between the solder interconnect and the die. However, having two polymer layers present in a BGA package is expensive.

Thus, what is needed are improved wafer-level packaging fabrication techniques that can meet desired reliability requirements and ongoing cost pressures, while enabling even tighter fabrication tolerances and smaller packages sizes.

BRIEF SUMMARY OF THE INVENTION

Methods, systems, and apparatuses for wafer-level integrated circuit (IC) packages are described. A routing interconnect is used to couple a chip terminal to a bump interconnect (or other package interconnect type). In one aspect, the routing interconnect directly connects (e.g., using solder) the chip terminal to the bump interconnect. In another aspect, another metal layer is added to the routing interconnect to mount the bump interconnect, to connect the chip terminal to the bump interconnect.

In another aspect, a single insulating layer is used to provide stress absorption for stresses applied to the bump interconnect, while enabling fewer manufacturing process steps than required in multiple polymer layer configurations.

In an example aspect of the present invention, an IC package includes an IC chip, an insulating layer on the surface of the IC chip, a plurality of vias, a plurality of routing interconnects, and a plurality of bump interconnects. The IC chip has a plurality of terminals configured in an array on a surface of the IC chip. A plurality of vias through the insulating layer provide access to the plurality of terminals. Each of the plurality of routing interconnects has a first portion and a second portion. The first portion of each routing interconnect is in contact with a respective terminal of the plurality of terminals through a respective via, and the second portion of each routing interconnect extends over the insulating layer. Each bump interconnect of the plurality of bump interconnects is connected to the second portion of a respective routing interconnect of the plurality of routing interconnects.

In another aspect of the present invention, a plurality of IC packages is formed. A wafer is received having a plurality of integrated circuit regions, each integrated circuit region having a plurality of terminals configured in an array on a surface of the wafer. An insulating layer is formed on the wafer. A plurality of vias is formed through the insulating layer to provide access to the plurality of terminals of each integrated circuit region. A plurality of routing interconnects is formed on the insulating layer such that each routing interconnect of the plurality of routing interconnects has a first portion in contact with a respective terminal through a respective via through the insulating layer and has a second portion that extends over the insulating layer. A plurality of bump interconnects are formed on the plurality of routing interconnects such that each bump interconnect of the plurality of bump interconnects is connected to the second portion of a respective routing interconnect of the plurality of routing interconnects.

In still another aspect of the present invention, a wafer level integrated circuit package structure includes a wafer, an insulating layer on the surface of the wafer, a plurality of vias through the insulating layer, a plurality of routing interconnects on the insulating layer, and a plurality of bump interconnects on the plurality of routing interconnects. The wafer has a plurality of integrated circuits regions. Each integrated circuit region has a plurality of accessible terminals configured in an array on a surface of the wafer. The plurality of vias provides access to the plurality of terminals of each integrated circuit region. Each routing interconnect of the plurality of routing interconnects has a first portion in contact with a respective terminal through a respective via and a second portion that extends over the insulating layer. Each bump interconnect of the plurality of bump interconnects is connected to the second portion of a respective routing interconnect of the plurality of routing interconnects.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
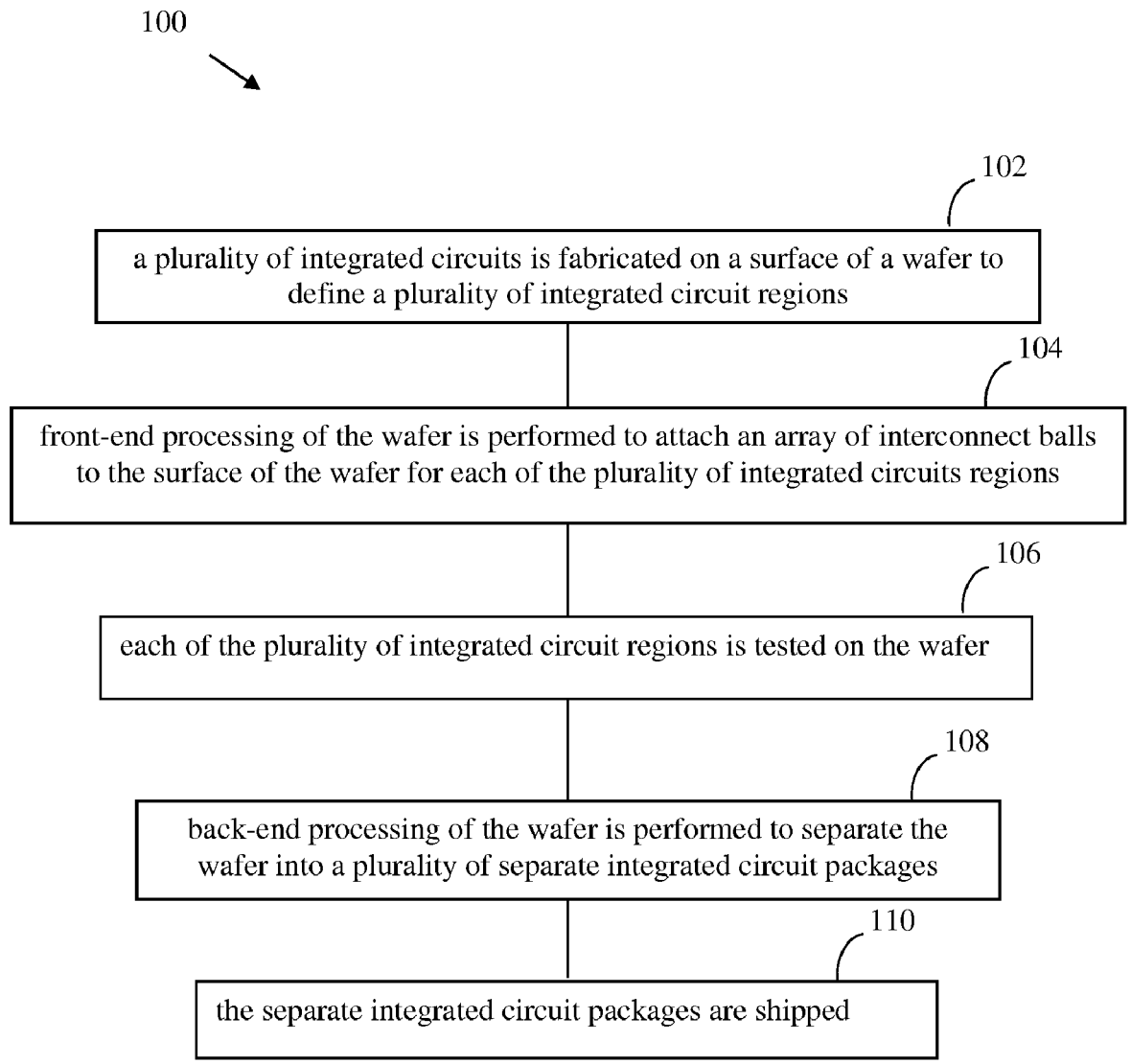
FIG. 1 shows a flowchart providing example steps for performing wafer-level package processing.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Conventional Wafer-Level Processing

"Wafer-level packaging" is an integrated circuit packaging technology where all packaging-related interconnects are applied while the integrated circuit dies or chips are still in wafer form. After the packaging-related interconnects are applied, the wafer is then tested and singulated into individual devices and sent directly to customers for their use. Thus, individual packaging of discreet devices is not required. The size of the final package is essentially the size of the corresponding chip, resulting in a very small package solution. Wafer-level packaging is becoming increasingly popular as the demand for increased functionality in small form-factor devices increases. These applications include mobile devices such as cell phones, PDAs, and MP3 players, for example.

Figure 2:
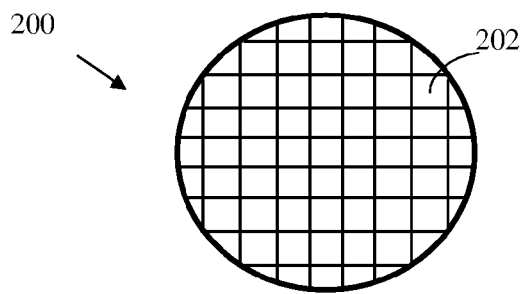
FIG. 2 shows a plan view of an example wafer.

FIG. 1 shows a flowchart 100 providing example steps for performing wafer-level package processing. Flowchart 100 begins with step 102. In step 102, a plurality of integrated circuits is fabricated on a surface of a wafer to define a plurality of integrated circuit regions. For example, FIG. 2 shows a plan view of a wafer 200. Wafer 200 may be silicon, gallium arsenide, or other wafer type. As shown in FIG. 2, wafer 200 has a surface 202 defined by a plurality of integrated circuit regions (shown as small rectangles in FIG. 2). Each integrated circuit region is configured to be packaged separately into a separate wafer-level ball grid array package according to the process of flowchart 100.

Figure 3:
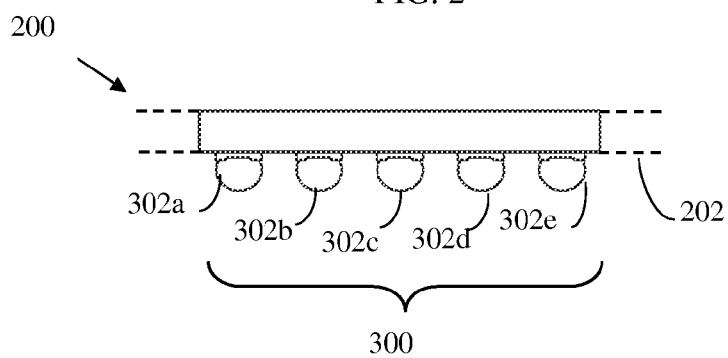
FIG. 3 shows a cross-sectional view of wafer, showing an example integrated circuit region in the wafer.

In step 104, front-end processing of the wafer is performed to attach an array of interconnect balls to the surface of the wafer for each of the plurality of integrated circuits regions. A critical part of wafer-level packaging is the front-end process of step 104. In this step, appropriate interconnects and packaging materials are applied to the wafer. For example, FIG. 3 shows a cross-sectional view of wafer 200, highlighting an integrated circuit region 300. As shown in FIG. 3, integrated circuit region 300 has a plurality of interconnect balls 302a-302e attached thereto on surface 202. Interconnect balls 302a-302e may be solder, other metal, combination of metals/alloy, etc. Interconnect balls 302 are used to interface the BGA package resulting from integrated circuit region 300 with an external device, such as a PCB.

In step 106, each of the plurality of integrated circuits regions is tested on the wafer. For example, each integrated circuit region can be interfaced with probes at interconnect balls 302 to provide ground, power, and test input signals, and to receive test output signals.

In step 108, back-end processing of the wafer is performed to separate the wafer into a plurality of separate integrated circuit packages. Example back-end processing is described below.

In step 110, the separate integrated circuit packages are shipped. For example, the separate integrated circuit packages may be shipped to a warehouse, to customers, to a site for assembly into devices, to a site for further processing, etc.

Figure 4:
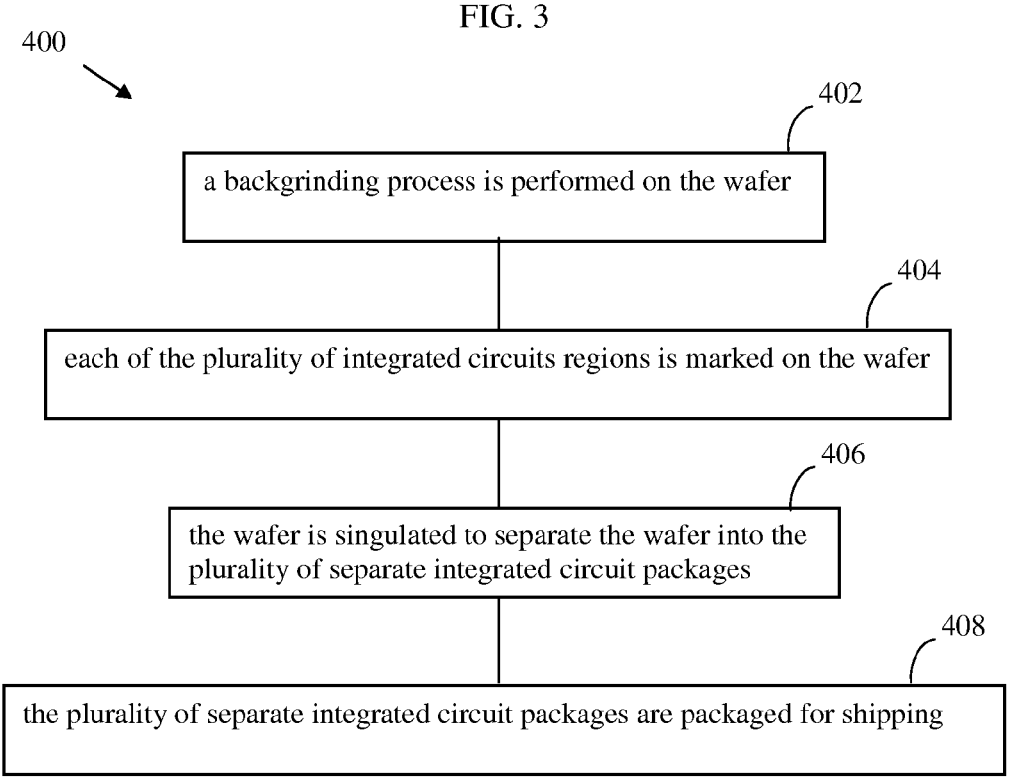
FIG. 4 shows a flowchart providing example steps for performing back-end processing of a wafer.

FIG. 4 shows a flowchart 400 providing example steps for performing back-end processing of a wafer, according to step 108 of flowchart 100. Not all steps of flowchart 400 are necessarily performed in all back-end processing applications. The steps of flowchart 400 need not necessarily be performed in the order shown. Flowchart 400 begins with step 402. In step 402, a backgrinding process is performed on the wafer. For example, the backgrinding process may be performed on wafer 200 to reduce a thickness of wafer 200 to a desired amount.

In step 404, each of the plurality of integrated circuits regions is marked on the wafer. For example, each integrated circuit region may be marked with information that may be used to identify the particular type of ball grid array package, such as manufacturer identifying information, part number information, etc. For instance, integrated circuit region 300 may be marked on the side of wafer 200 that is opposite surface 202 shown in FIG. 3.

In step 406, the wafer is singulated to separate the wafer into the plurality of separate integrated circuit packages. Wafer 200 may be singulated/diced in any appropriate manner to physically separate the integrated circuit regions from each other, as would be known to persons skilled in the relevant art(s).

In step 408, the plurality of separate integrated circuit packages are packaged for shipping. For example, the separated integrated circuit packages may be placed in one or more tapes/reels, individual packaging, or other transport mechanism, for shipping packages to customers, etc.

Reliable performance of wafer-level packages is extremely important. In many applications using these types of packages, such as hand-held mobile devices, the interconnections between the packages and the devices in which they are incorporated, and the packages themselves, must be able to sustain various stresses. Example stresses include temperature cycles (e.g., environmental temperature changes or power on/off cycles) and mechanical shocks (e.g., dropping of a device). The structure of the wafer-level package plays a critical role in the reliability of the package and the reliability of the interconnections between the package and the system.

The front-end process of step 104 is critical to forming a reliable IC package. Aspects of the front-end process of step 104 may be performed differently, depending on factors such as the way the wafer is fabricated, etc. In some cases, the front-end process needs to deposit metal layers to provide circuitry/routing from chip terminals to external package terminals. Such metal layers are typically referred to as redistribution layers (RDLs).

There are three common approaches to the "front-end" process of step 104. In the first approach, "redistribution layers" (RDLs), under bump metallization layers (UBMs), and bump interconnects (along with multiple polymer layers) are used to route electrical signals from chip terminals to external (e.g., PCB) terminals. An example of the first approach is described below with respect to flowchart 500 of FIG. 5. In the second approach, RDLs are not used. Instead, a single polymer layer, UBMs, and bump interconnects are applied to route signals between on-chip terminals and external terminals. In the third approach, RDLs are not used. UBMs and bump interconnects are applied to route signals between on-chip terminals and external terminals. The second and third approaches are also described further below.

Figure 5:
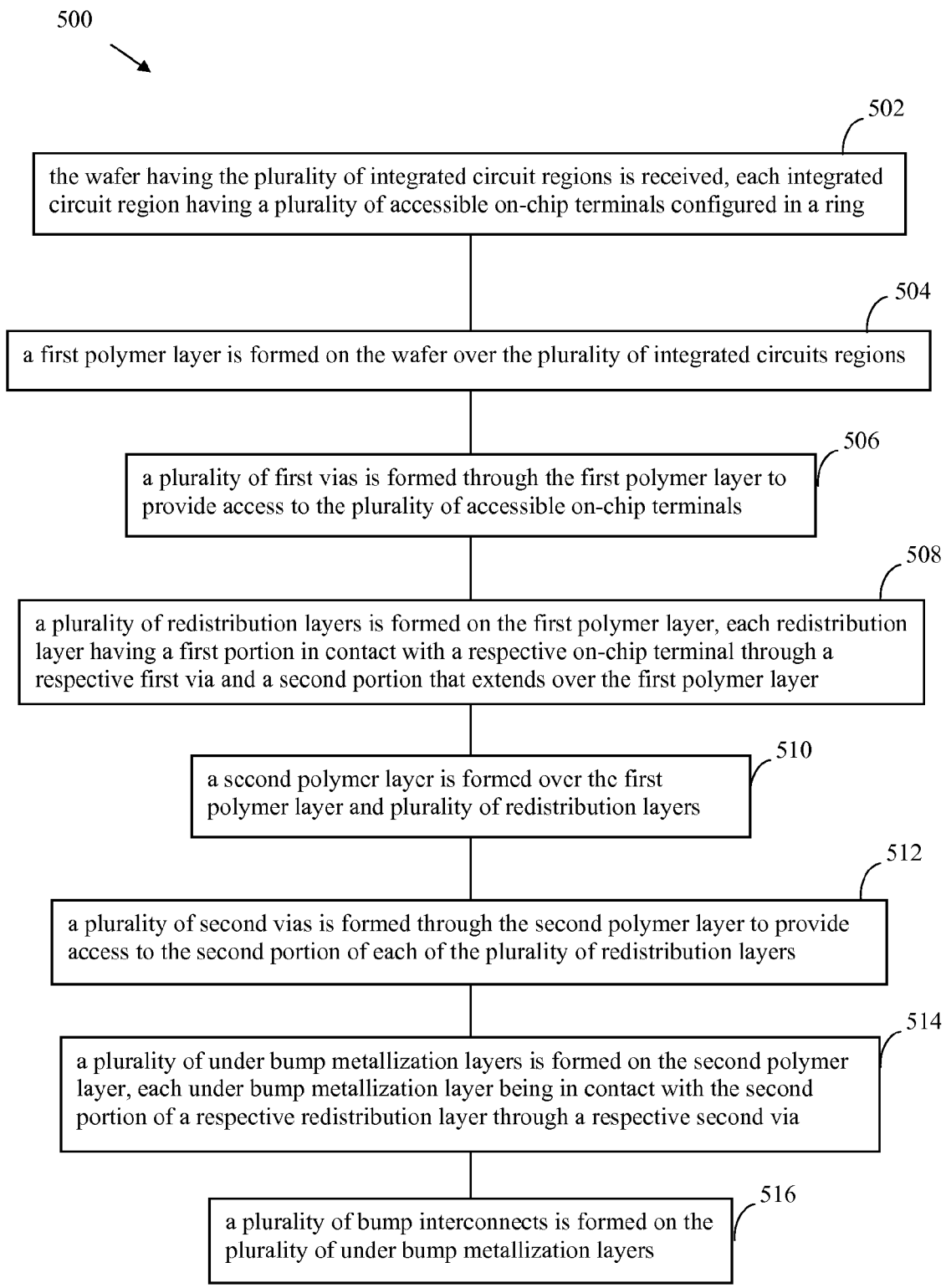
FIG. 5 shows a flowchart providing example steps for performing front-end processing of a wafer with redistribution layers and under bump metallization layers.

FIG. 5 shows a flowchart 500 providing example steps for performing front-end processing of a wafer with redistribution layers and under bump metallization layers.

Figure 6:
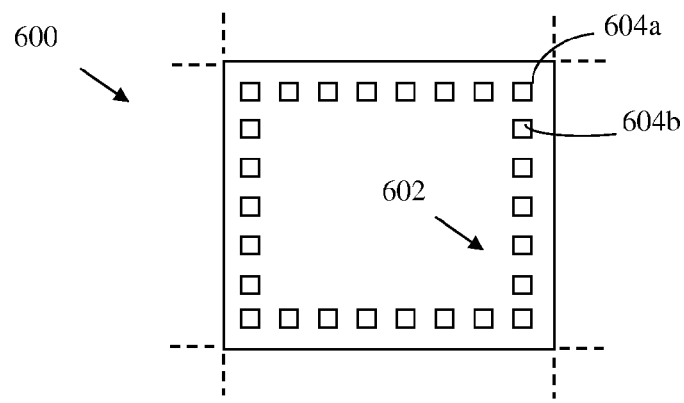
FIG. 6 shows a view of an integrated circuit region of a wafer.

Flowchart 500 begins with step 502. In step 502, the wafer having the plurality of integrated circuit regions is received, each integrated circuit region having a plurality of accessible on-chip terminals configured in a ring. For instance, FIG. 6 shows a bottom view of an integrated circuit region 600 of a wafer, such as wafer 200 shown in FIG. 2. As shown in FIG. 6, integrated circuit region 600 includes a ring 602 of terminals 604 (terminals 604a and 604b are individually indicated in FIG. 6). Terminals 604 are arranged in ring 602 on the bottom surface (e.g., surface 202) of integrated circuit region 600 adjacent to a peripheral circumferential edge of integrated circuit region 600. An integrated circuit region can include one or more of such rings 602. Terminals 604 may be input, output, test, power, ground, etc., pads for an integrated circuit chip/die fabricated in, and defined by integrated circuit region 600.

Figure 7:
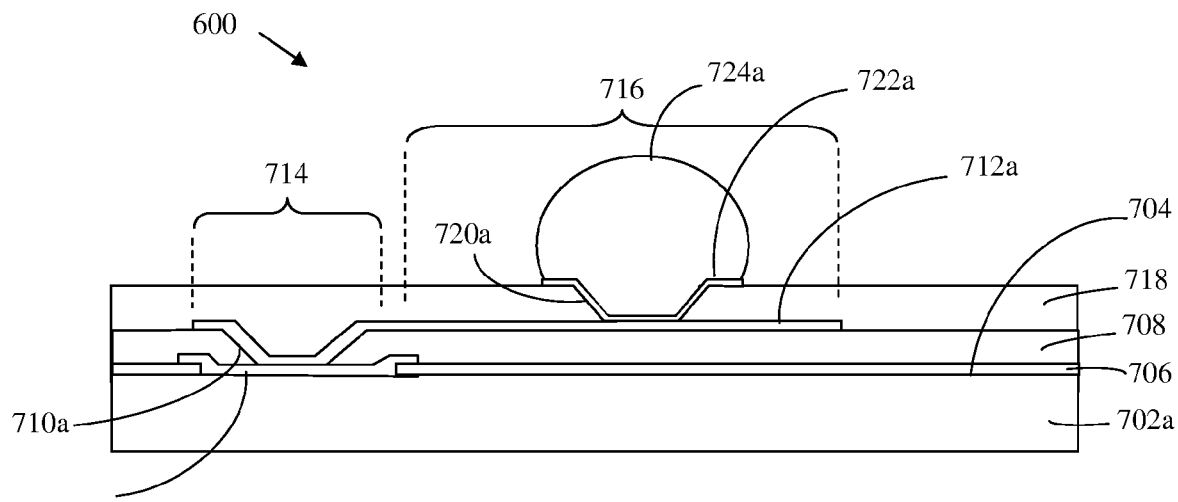
FIG. 7 shows a cross-sectional view of a portion of an integrated circuit region of a wafer.

In step 504, a first polymer layer is formed on the wafer over the plurality of integrated circuits regions. FIG. 7 shows a cross-sectional view of a portion of integrated circuit region 600, as processed according to flowchart 500. As shown in FIG. 7, the portion of integrated circuit region 600 shown includes a chip portion 702a, a terminal 604a on a top surface 704 of chip portion 702a, and a passivation layer 706 that covers the remainder of top surface 704 of chip portion 702a. A first polymer layer 708 is formed on the wafer over integrated circuit region 600 (and other integrated circuit regions on the wafer), covering terminal 604a and passivation layer 706.

In step 506, a plurality of first vias is formed through the first polymer layer to provide access to the plurality of accessible on-chip terminals. For example, as shown in FIG. 7, a first via 710a is formed through first polymer layer 708. Similarly to first via 710a, a plurality of vias 710 are formed through first polymer layer 708, each providing access to a respective terminal 604 of integrated circuit region 600.

In step 508, a plurality of redistribution layers is formed on the first polymer layer, each redistribution layer having a first portion in contact with a respective on-chip terminal through a respective first via and a second portion that extends over the first polymer layer. For example, as shown in FIG. 7, a redistribution layer 712a is formed on first polymer layer 708. As shown, a first portion 714 of redistribution layer 712a is in contact with terminal 604a through first via 710a, and a second portion 716 of redistribution layer 712 extends (e.g., laterally) over first polymer layer 708. In this manner, a plurality of redistribution layers 712 are formed.

Figure 8:
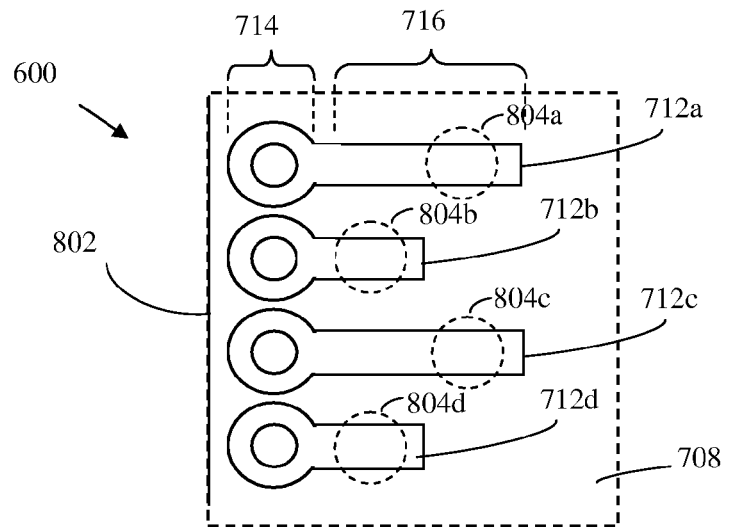
FIG. 8 shows a plan view of a portion of an integrated circuit region of a wafer.

For instance, FIG. 8 shows a plan view of a portion of integrated circuit region 600 at a left edge 802 of integrated circuit region 600. As shown in FIG. 8, four redistribution layers 712a-712d are formed on first polymer layer 708, each redistribution layer having a first portion 714 and a second portion 716. The first portions 714 of redistribution layers 712a-712d are in contact with four corresponding terminals (not visible in FIG. 8) through four corresponding first vias (not visible in FIG. 8). The second portions 716 of redistribution layers 712a-712d extend over first polymer layer 708 (e.g., in the right direction in FIG. 8).

Redistribution layers (RDL) 712 can be deposited to first polymer layer 708 according to many techniques (e.g., plating, sputtering, etc.) and can be processed (e.g., patterned) using many different lithography or other methods, as would be known to persons skilled in the relevant art(s). First portion 714 of redistribution layer 712a is similar to standard via plating, and second portion 716 of redistribution layer 712a extends from first portion 714 in a similar fashion as a standard metal trace formed on a substrate.

In step 510, a second polymer layer is formed over the first polymer layer and plurality of redistribution layers. For example, as shown in FIG. 7, a second polymer layer 718 is formed on the wafer over integrated circuit region 600 (and other integrated circuit regions on the wafer), covering first polymer layer 708 and redistribution layer 712a.

In step 512, a plurality of second vias is formed through the second polymer layer to provide access to the second portion of each of the plurality of redistribution layers. For example, as shown in FIG. 7, a second via 720a is formed through second polymer layer 718 to provide access to second portion 716 of redistribution layer 712a. In this manner, a plurality of second vias 720 are formed through second polymer layer 718, each providing access to a respective second portion 716 of a redistribution layer 712. For instance, FIG. 8 shows positions 804a-804d (represented with dotted lines) where second vias 720a-720d corresponding to redistribution layers 712a-712d can be formed through second polymer layer 718 (not shown in FIG. 8).

In step 514, a plurality of under bump metallization layers is formed on the second polymer layer, each under bump metallization layer being in contact with the second portion of a respective redistribution layer through a respective second via. For example, as shown in FIG. 7, an under bump metallization layer 722a is in contact with second portion 716 of redistribution layer 712a through second via 720a. In this manner, a plurality of under bump metallization layers 722 may be formed in contact with respective redistribution layers 712 through respective second vias 720. For instance, in FIG. 8, under bump metallization layers 722a-722d (not shown in FIG. 8) may be formed in positions 804a-804d through respective second vias 720a-720d (not shown in FIG. 8).

Under bump metallization (UBM) layers 722 are typically one or more metal layers formed (e.g., metal deposition—plating, sputtering, etc.) to provide a robust interface between redistribution layers 722 and a package interconnect mechanism (such as a bump interconnect, such as described in step 516). A UBM layer serves as a solderable layer for a solder package interconnect mechanism. Furthermore, a UBM provides protection for underlying metal or circuitry from chemical/thermal/electrical interactions between the various metals/alloys used for the package interconnect mechanism. In an embodiment, UBM layers 722 are formed similarly to standard via plating.

In step 516, a plurality of bump interconnects is formed on the plurality of under bump metallization layers. For example, as shown in FIG. 7, a bump interconnect 724a is formed on under bump metallization layer 722a. In this manner, a plurality of bump interconnects 724 may be formed in contact with respective under bump metallization layers 722. For instance, in FIG. 8, bump interconnects 724a-724d (not shown in FIG. 8) may be formed in positions 804a-804d, each in contact with a respective one of under bump metallization layers 722a-722d (not shown in FIG. 8). Bump interconnects 724 may be solder balls, for instance.

In this manner, an electrical connection is formed from each terminal 604 to a respective bump interconnect 724 (i.e., through a respective redistribution layer 712 and under bump metallization layer 722). As just described with respect to flowchart 500, multiple polymer layers (e.g., layers 708 and 718) may be used to support the electrical connection. In many cases, single or multiple polymer material layers are deposited on the wafer below, above, or between the various applied RDL or UBM metal layers. The polymer layers serve multiple purposes. For example, they provide electrical isolation between the different circuitry/metal layers including between redistribution layers 712 and under bump metallization layers 722 and the circuitry within the chip (chip portion 702a). The polymer layers are a relatively soft material that provides a layer between the package-to-system interconnect (e.g., bump interconnect 724) and the chip to serve as a mechanical buffer to protect the chip, absorbing external stresses that are applied to the interconnect. The polymer layers further provide a layer between the package-to-system interconnect and the chip that can serve as a mechanical buffer to protect the interconnect from stresses that may result due to mismatches in material behavior of the various materials in the package and system (chip, PCB, solder, etc.)

The first front-end approach described with respect to flowchart 500 has disadvantages. For example, two polymer layers are needed, as well as deposition of an RDL layer, which require many process steps and additional materials, adding cost. Also, many new chips are being designed so that the RDL-type routing between the chip terminals and external terminals is not required. In other words, the chip terminals are designed to be coincident with the external terminals by performing the routing within the chip (e.g., during circuit fabrication in step 102 of flowchart 100), rather than using chip-external RDLs. The second and third front-end approaches relate to packages having chip terminals that are coincident with the external terminals.

Figure 9:
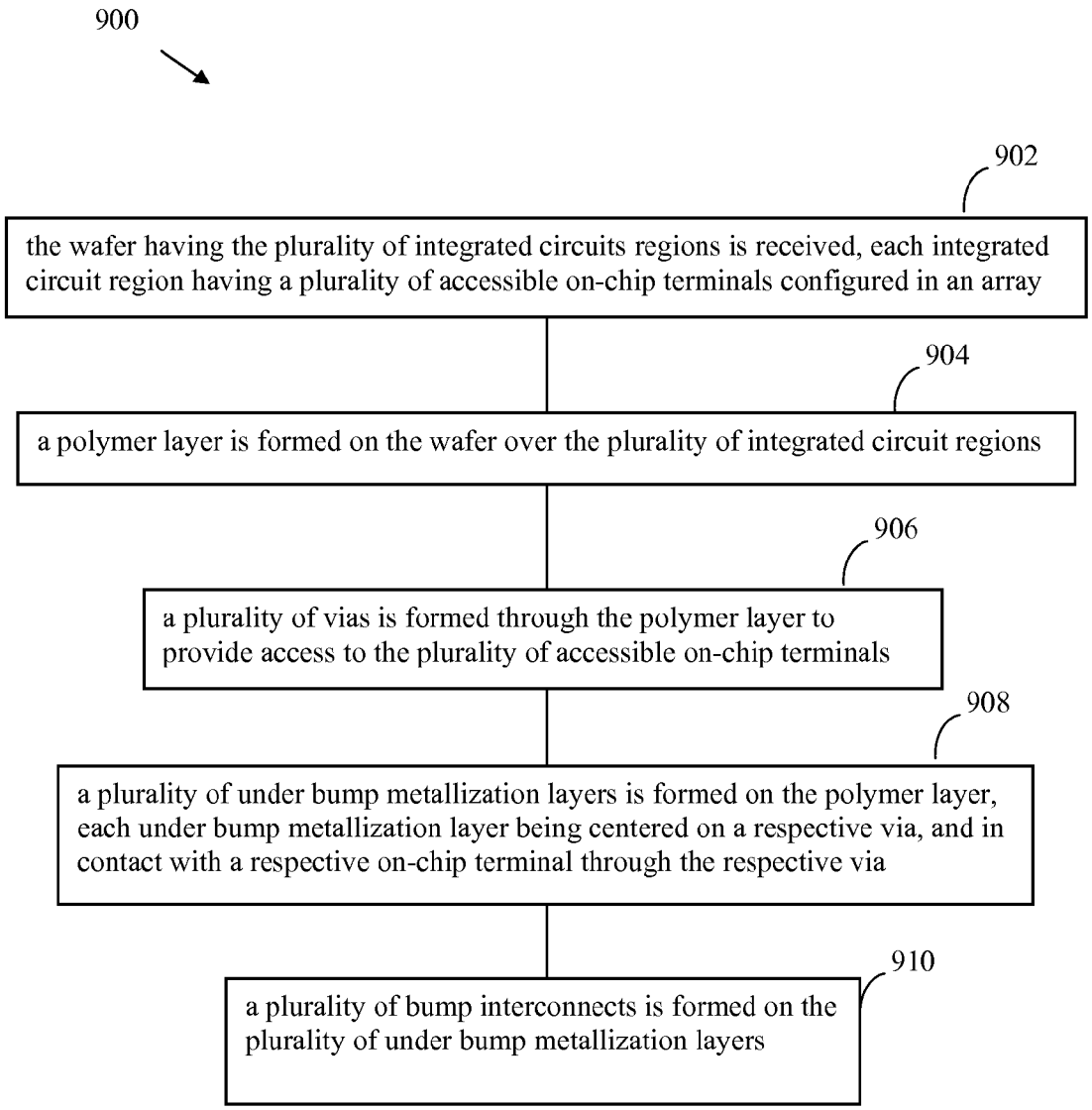
FIG. 9 shows a flowchart providing example steps for performing front-end processing of a wafer with under bump metallization layers.
Figure 10:
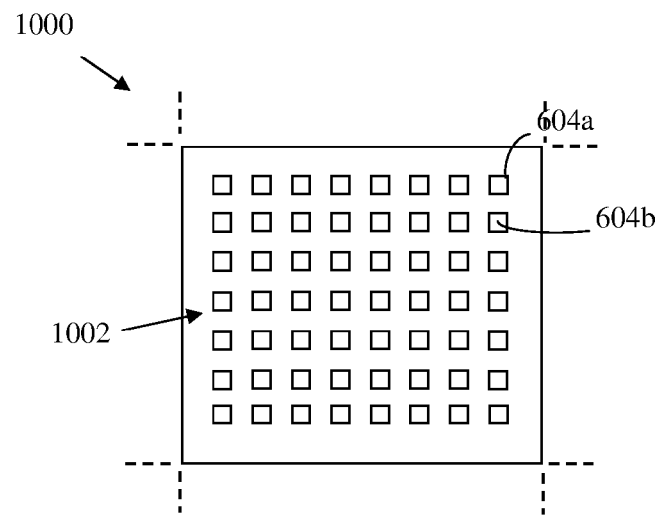
FIG. 10 shows a view of an integrated circuit region of a wafer.

FIG. 9 shows a flowchart 900 providing example steps for performing front-end processing of a wafer according to the second approach. Flowchart 900 begins with step 902. In step 902, the wafer having the plurality of integrated circuits regions is received, each integrated circuit region having a plurality of accessible on-chip terminals configured in an array. For instance, FIG. 10 shows a bottom view of an integrated circuit region 1000 of a wafer, such as wafer 200 shown in FIG. 2. As shown in FIG. 10, integrated circuit region 1000 includes a rectangular array 1002 of terminals 604 (terminals 604a and 604b are individually indicated in FIG. 10). Terminals 604 are arranged in array 1002 on the bottom surface (e.g., surface 202) of integrated circuit region 1000.

Figure 11:
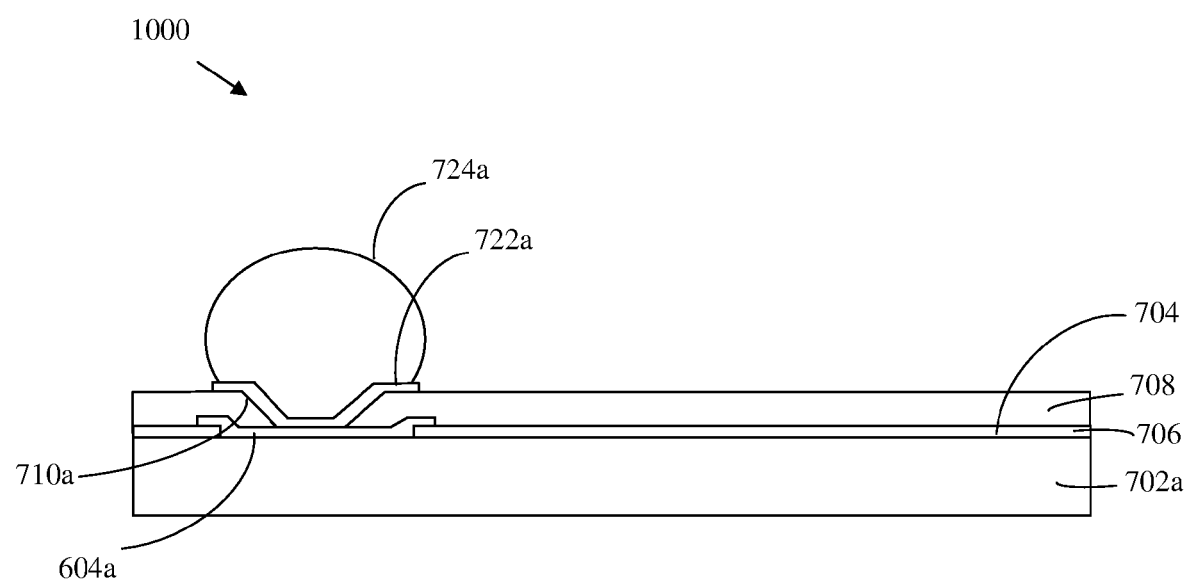
FIG. 11 shows a cross-sectional view of a portion of an integrated circuit region of a wafer.

In step 904, a polymer layer is formed on the wafer over the plurality of integrated circuit regions. FIG. 11 shows a cross-sectional view of a portion of integrated circuit region 1100, as processed according to flowchart 900. As shown in FIG. 11, the portion of integrated circuit region 1000 shown includes chip portion 702a, terminal 604a on a top surface 704 of chip portion 702a, and passivation layer 706 that covers the top surface 704 of chip portion 702a (other than terminal 604a). Polymer layer 708 is formed on the wafer over integrated circuit region 1000 (and other integrated circuit regions on the wafer), covering terminal 604a and passivation layer 706.

In step 906, a plurality of vias is formed through the polymer layer to provide access to the plurality of accessible on-chip terminals. For example, as shown in FIG. 11, a via 710a is formed through polymer layer 708. Similarly to via 710a, a plurality of vias 710 is formed through polymer layer 708, each via 710 providing access to a respective terminal 604 of integrated circuit region 1000.

In step 908, a plurality of under bump metallization layers is formed on the polymer layer, each under bump metallization layer being centered on a respective via, and in contact with a respective on-chip terminal through the respective via. For example, as shown in FIG. 11, an under bump metallization layer 722a is in contact with terminal 604a through via 710a. In this manner, a plurality of under bump metallization layers 722 may be formed in contact with respective terminals 604 through respective vias 710.

In step 910, a plurality of bump interconnects is formed on the plurality of under bump metallization layers. For example, as shown in FIG. 11, a bump interconnect 724a is formed on under bump metallization layer 722a. Similarly to bump interconnect 724a, a plurality of bump interconnects 724 may be formed in contact with respective under bump metallization layers 722. In this manner, an electrical connection is formed from each terminal 604 to a respective bump interconnect 724 (i.e., through a respective under bump metallization layer 722).

The second front-end approach of flowchart 900 has disadvantages. The second approach is lower in cost relative to the first approach (flowchart 500), since fewer steps are required, only a single polymer level (polymer layer 708) is used, and a redistribution layer is not required. However, the chip terminals are coincident with the external terminals. During operating conditions or reliability assessment testing, external stresses are applied to the resulting IC package. The applied stresses transfer to the IC package through the bump interconnects 724a. Although there is some polymer material (polymer layer 708) between the chip (chip portion 702a) and bump interconnect 724a, a large portion of the interface is still a rigid connection (terminal 604a to UBM 722a). The second approach represents a significant risk of chip damage due to a transferred stress between bump interconnect 724a and chip portion 702a through this rigid connection.

Figure 12:
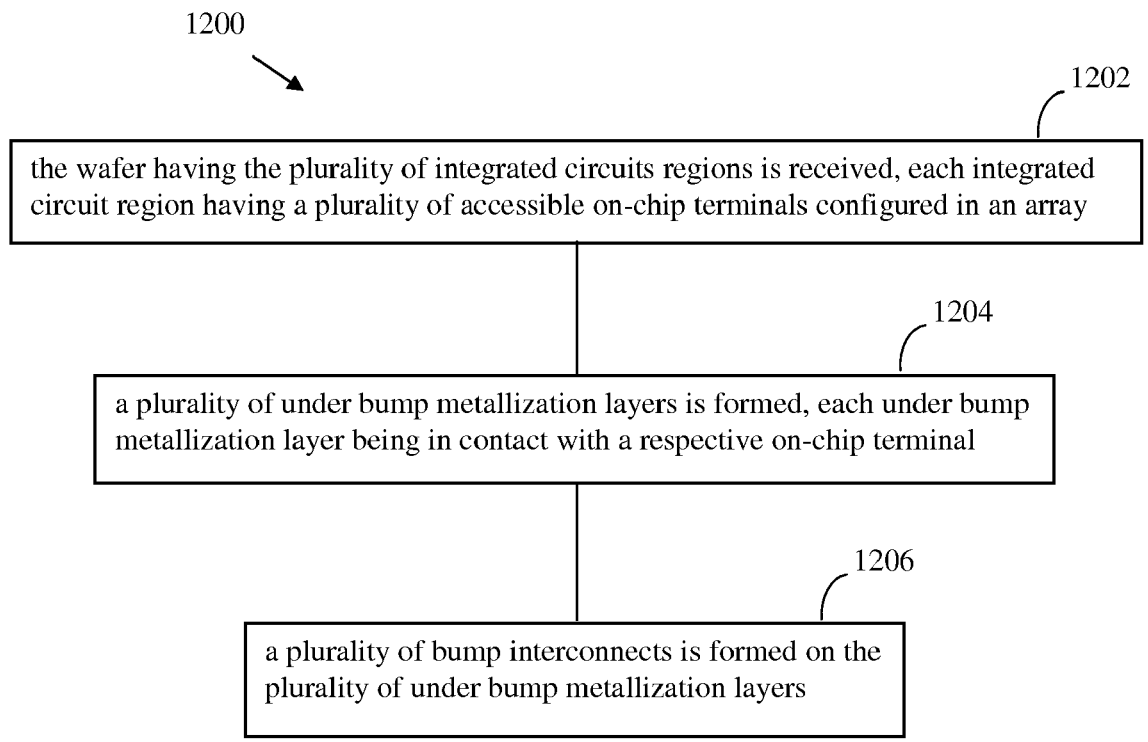
FIG. 12 shows a flowchart providing example steps for performing front-end processing of a wafer with under bump metallization layers.

FIG. 12 shows a flowchart 1200 providing example steps for performing front-end processing of a wafer according to the third approach. Flowchart 1200 begins with step 1202. In step 1202, the wafer having the plurality of integrated circuits regions is received, each integrated circuit region having a plurality of accessible on-chip terminals configured in an array. For instance, a wafer similar to wafer 200 shown in FIG. 2 may be received, that has a plurality of integrated circuit regions similar to integrated circuit region 1000 shown in FIG. 10.

Figure 13:
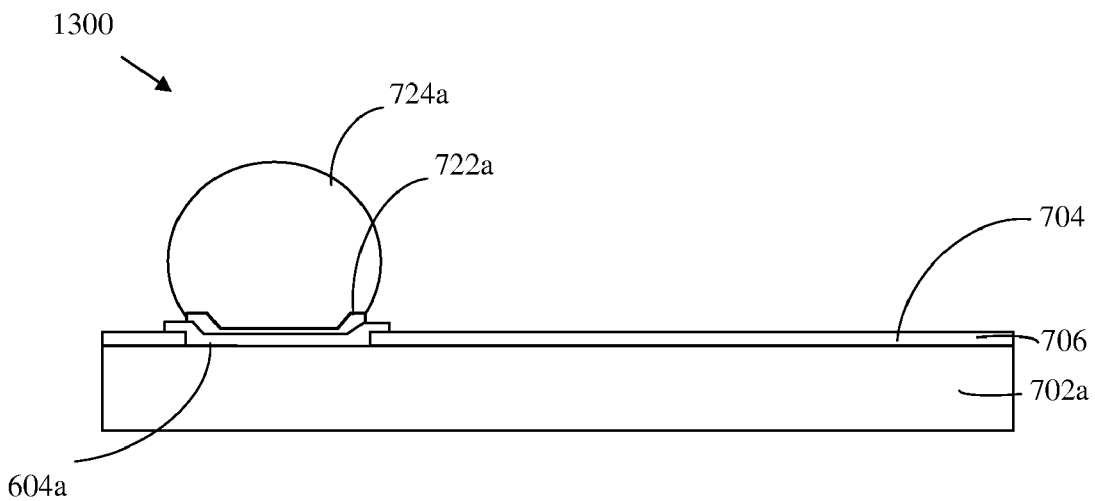
FIG. 13 shows a cross-sectional view of a portion of an integrated circuit region of a wafer.

In step 1204, a plurality of under bump metallization layers is formed, each under bump metallization layer being in contact with a respective on-chip terminal. FIG. 13 shows a cross-sectional view of a portion of an integrated circuit region 1300, as processed according to flowchart 1200. As shown in FIG. 13, the portion of integrated circuit region 1300 shown includes chip portion 702a, terminal 604a on a top surface 704 of chip portion 702a, and passivation layer 706 that covers the remainder of top surface 704 of chip portion 702a. Also, as shown in FIG. 13, an under bump metallization layer 722a is formed directly on terminal 604a. In this manner, a plurality of under bump metallization layers 722 may be formed in contact with respective terminals 604 of the integrated circuit region.

In step 1206, a plurality of bump interconnects is formed on the plurality of under bump metallization layers. For example, as shown in FIG. 13, a bump interconnect 724a is formed on under bump metallization layer 722a. Likewise, a plurality of bump interconnects 724 may be formed in contact with respective under bump metallization layers 722.

In this manner, an electrical connection is formed from each terminal 604 to a respective bump interconnect 724 (i.e., through a respective under bump metallization layer 722). The third front-end approach of flowchart 1300 has disadvantages. The third approach is lower in cost relative to the first and second approaches (flowcharts 500 and 900), since fewer steps are required, a polymer level is not used, and a redistribution layer is not required. However, because a polymer layer is not present, the only interface between the chip (chip portion 702) and bump interconnect 724a is under bump metallization layer 722a, which is typically rigid. Therefore, most stress received at bump interconnect 724a is transferred directly to the chip. This represents a significant risk of causing chip damage. The risk is increased for advanced silicon process technologies which use low-k dielectric materials which are very fragile and easily damaged.

Example embodiments of the present invention are described in the following section that overcome the disadvantages of the three front-end processing approaches described above.

EXAMPLE EMBODIMENTS

The example embodiments described herein are provided for illustrative purposes, and are not limiting. The examples described herein may be adapted to a variety of types of integrated circuit packages. Further structural and operational embodiments, including modifications/alterations, will become apparent to persons skilled in the relevant art(s) from the teachings herein.

According to an embodiment, a routing interconnect for each chip terminal is used to couple the chip terminal to a bump interconnect (or other package interconnect type). In an embodiment, the routing interconnect directly connects the chip terminal to the bump interconnect. In another embodiment, an under bump metallization layer mounts the bump interconnect to the routing interconnect, and thus is also used to connect the chip terminal to the bump interconnect. In embodiments, an insulating layer between the routing interconnect and chip is used to provide stress absorption, while allowing for fewer manufacturing process steps than required in multiple polymer layer configurations.

Figure 14:
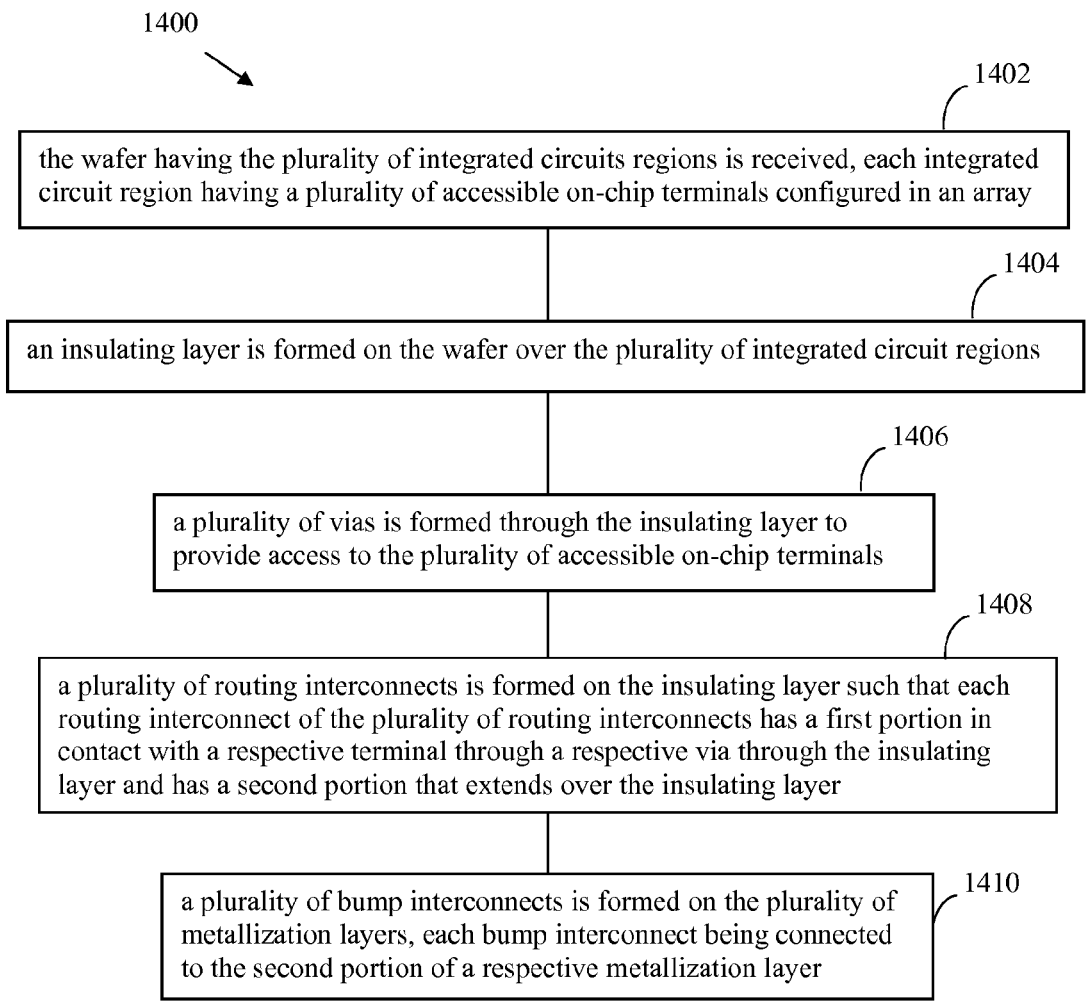
FIG. 14 shows a flowchart for forming integrated circuit packages, according to an embodiment of the present invention.

FIG. 14 shows a flowchart 1400 for forming integrated circuit packages, according to an embodiment of the present invention. Other structural and operational embodiments will be apparent to persons skilled in the relevant art(s) based on the discussion provided herein.

Flowchart 1400 begins with step 1402. In step 1402, the wafer having the plurality of integrated circuits regions is received, each integrated circuit region having a plurality of accessible on-chip terminals configured in an array. For instance, a wafer similar to wafer 200 shown in FIG. 2 may be received, that has a plurality of integrated circuit regions similar to integrated circuit region 1000 shown in FIG. 10. As shown in FIG. 10, integrated circuit region 1000 includes a rectangular array 1002 of terminals 604 (terminals 604a and 604b are individually indicated in FIG. 10). Terminals 604 are arranged in array 1002 on the bottom surface (e.g., surface 202) of integrated circuit region 1000. Array 1002 may be a regular rectangular array of terminals as shown in FIG. 10, or may have other terminal array patterns or arrangements, including a staggered array of terminals, etc. Array 1002 does not necessarily need to be a full array of terminals 604.

Figure 15:
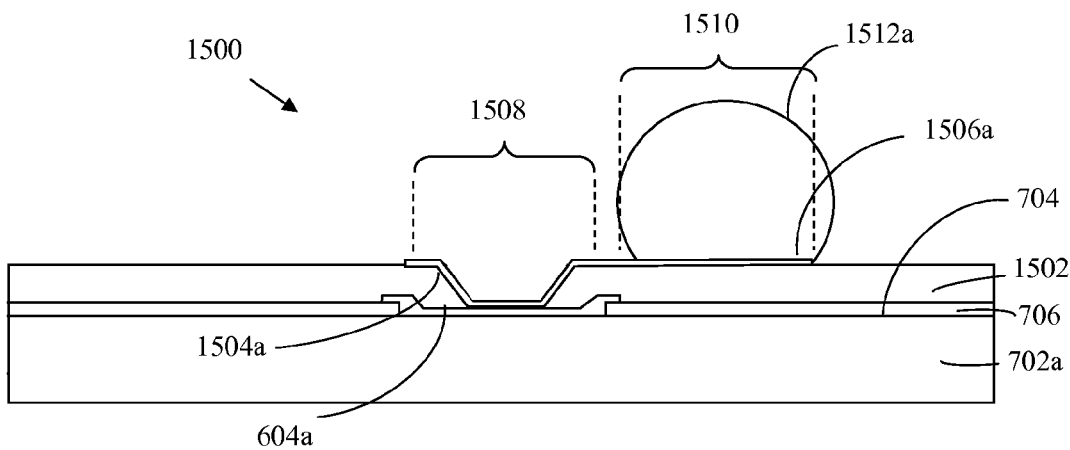
FIG. 15 shows a cross-sectional view of a portion of an integrated circuit region processed according to the flowchart of FIG. 14, according to an embodiment of the present invention.

In step 1404, an insulating layer is formed on the wafer over the plurality of integrated circuit regions. FIG. 15 shows a cross-sectional view of a portion of an integrated circuit region 1500, as processed according to flowchart 1400, according to an embodiment of the present invention. The portion of integrated circuit region 1500 shown in FIG. 15 includes chip portion 702a, terminal 604a on a top surface 704 of chip portion 702a, and passivation layer 706 that covers top surface 704 of chip portion 702a (other than terminal 604a). A layer 1502 of insulating material is formed on the wafer over integrated circuit region 1500 (and other integrated circuit regions on the wafer), covering terminal 604a and passivation layer 706. Insulating layer 1502 may be a shock absorbing and electrically insulating material, such as a polymer, a dielectric material, and/or other shock absorbing and electrically insulating material. Insulating layer 1502 may include one or more layers of material. Insulating layer 1502 may be applied in any manner, conventional or otherwise, as would be known to persons skilled in the relevant art(s).

Figure 16:
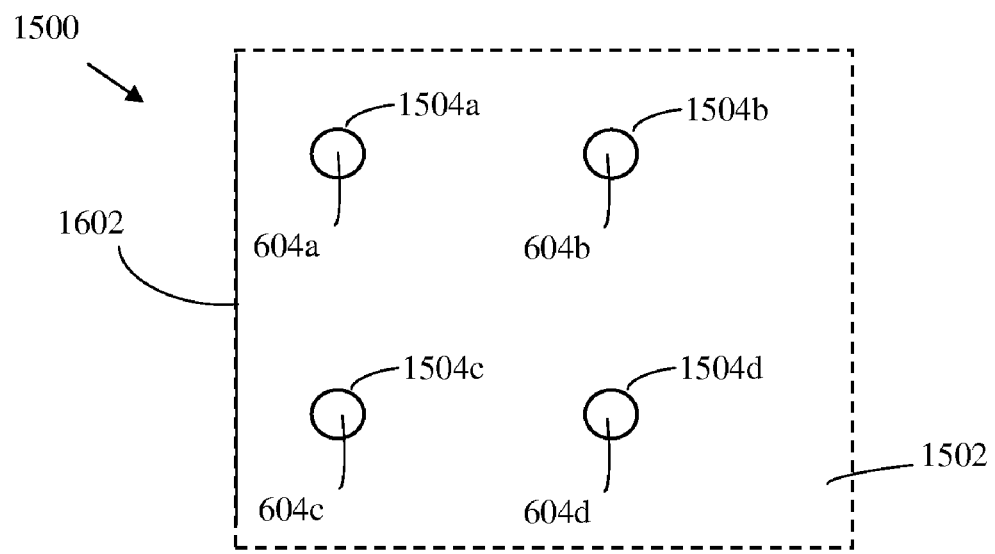
FIGS. 16-18 show plan views of a portion of an integrated circuit region at various stages of front-end assembly, according to example embodiments of the present invention.

In step 1406, a plurality of vias is formed through the insulating layer to provide access to the plurality of accessible on-chip terminals. For example, as shown in FIG. 15, a via 1504a is formed through insulating layer 1502. A plurality of vias 1504 are formed through insulating layer 1502, each providing access to a respective terminal 604 of integrated circuit region 1500. For example, FIG. 16 shows a plan view of a portion of integrated circuit region 1500 adjacent to a left edge 1602 of region 1500, according to an example embodiment of the present invention. Four vias 1504a-1504d are shown that are a portion of a larger array of vias 1504. As shown in FIG. 16, vias 1504a-1504d are formed through insulating layer 1502, providing respective access to terminals 604a-604d. Note that vias 1504 may have sloped walls, as shown in FIG. 15, may have straight vertical walls (e.g., via 1504 may have a cylindrical shape), or may have other shapes. Vias 1504 may be formed in any manner, including etching, drilling, etc., as would be known to persons skilled in the relevant art(s).

In step 1408, a plurality of routing interconnects is formed on the insulating layer such that each routing interconnect of the plurality of routing interconnects has a first portion in contact with a respective terminal through a respective via through the insulating layer and has a second portion that extends over the insulating layer. For example, as shown in FIG. 15, a routing interconnect 1506a is formed on insulating layer 1502. Routing interconnect 1506 has a first portion 1508 and a second portion 1510, similarly to routing distribution layer 712a shown in FIG. 7. First portion 1508 of routing interconnect 1506 is in contact with terminal 604a through via 1504a, and second portion 1510 of routing interconnect 1506 extends (e.g., laterally) over insulating layer 1502. In this manner, a plurality of redistribution layers 1502 are formed for integrated circuit region 1500.

Figure 17:
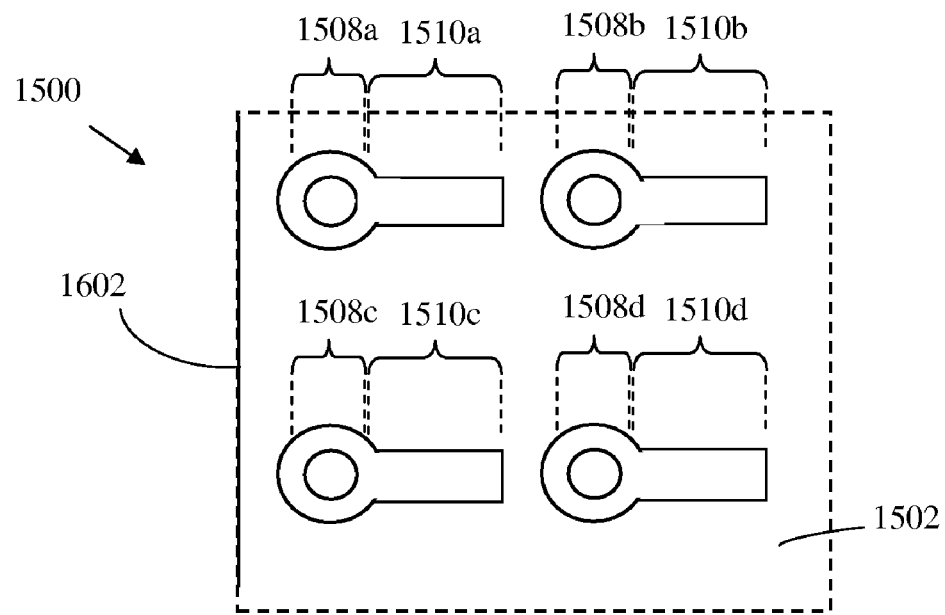

For instance, FIG. 17 shows a plan view of the portion of integrated circuit region 1500 shown in FIG. 16. In FIG. 17, four routing interconnects 1506a-1506d are formed on insulating layer 1502, each routing interconnect having a first portion 1508 and a second portion 1510. The first portions 1508a-1508d of routing interconnects 1506a-1506d are in contact with a corresponding one of terminals 604a-604d (shown in FIG. 16) through a corresponding one of vias 1504a-1504d (shown in FIG. 16). The second portions 1510a-1510d of routing interconnects 1506a-1506d extend over insulating layer 1502 (e.g., in the right direction in FIG. 16).

Note that second portions 1510 of routing interconnects 1506 can have various shapes. For example, as shown in FIG. 17, second portions 1508 may be rectangular shaped. Alternatively, second portions 1508 may have rounded shapes, such as described in detail with respect to some examples below, or may have other shapes. For example, first portion 1508 of routing interconnect 1506a may be similar to a standard via plating, and second portion 1510 of routing interconnect 1506a may extend from first portion 1508 in a similar fashion as a standard metal trace formed on a substrate. Routing interconnects 1506 may be formed of any suitable electrically conductive material, including a metal such as a solder or solder alloy, copper, aluminum, gold, silver, nickel, tin, titanium, a combination of metals/alloy, etc. Routing interconnects 1506 may be formed in any manner, including sputtering, plating, lithographic processes, etc., as would be known to persons skilled in the relevant art(s).

In step 1410, a plurality of bump interconnects is formed on the plurality of metallization layers, each bump interconnect being connected to the second portion of a respective metallization layer. For example, as shown in FIG. 15, a bump interconnect 1512a is formed on routing interconnect 1506a. In this manner, a plurality of bump interconnects 1512 may be formed in contact with respective routing interconnects 1506. For instance, in FIG. 18, a plurality of bump interconnects 1512a-1512d are formed as part of an array of bump interconnects 1512, each in contact with a respective one of routing interconnects 1506a-1506d. Bump interconnects 1512 may be formed of any suitable electrically conductive material, including a metal such as a solder or solder alloy, copper, aluminum, gold, silver, nickel, tin, titanium, a combination of metals/alloy, etc. Bump interconnects 1512 may have any size and pitch, as desired for a particular application. Bump interconnects 1512 may be formed in any manner, including sputtering, plating, lithographic processes, etc., as would be known to persons skilled in the relevant art(s).

In this manner, an electrical connection is formed from each terminal 604 to a respective bump interconnect 1512 using a respective routing interconnect 1506. Any number of such electrical connections may be formed as dictated by a particular application, including forming electrical connections for tens, hundreds, or even larger arrays of terminals 604. After the wafer is processed according to flowchart 1400, further steps of flowchart 100 shown in FIG. 1 may be applied to the wafer to process the integrated circuit regions into separate integrated circuit packages. For example, each integrated circuit region may be tested (step 106), back end processing may be performed to separate the regions into separate integrated circuit packages (step 108), and the separate packages can be processed for shipping (step 110).

Figure 18:
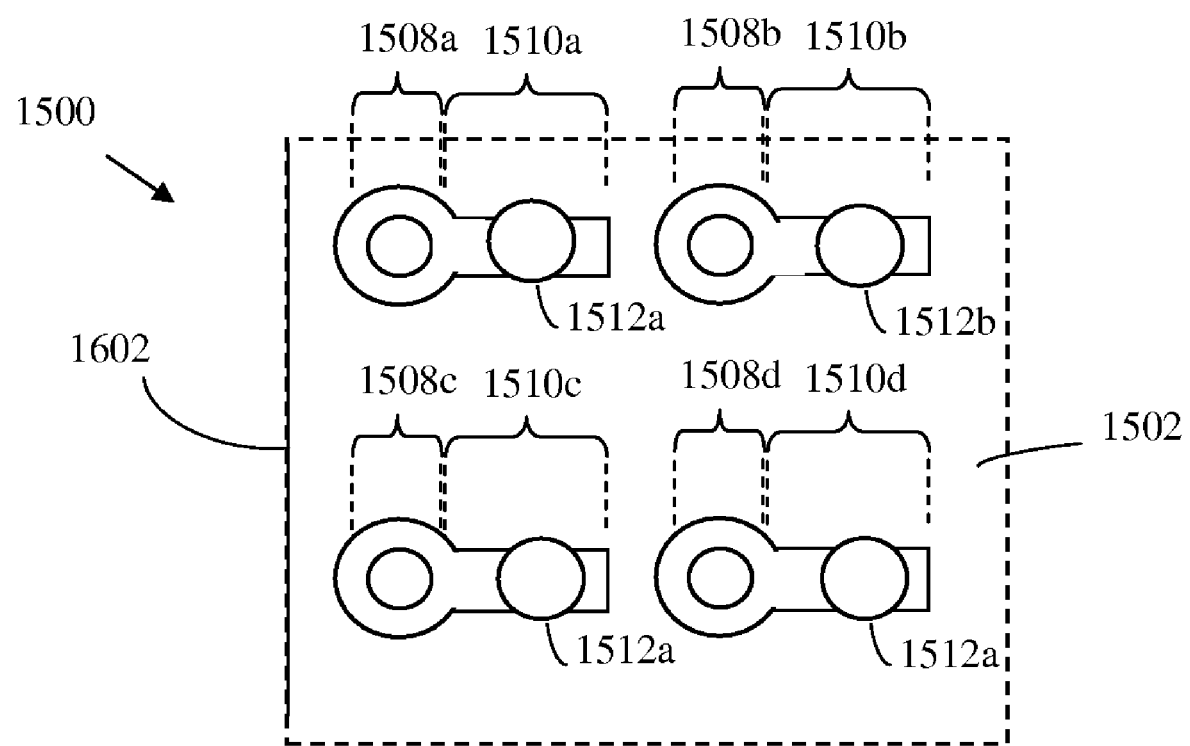

As shown in FIGS. 15 and 18, in an embodiment, bump interconnects 1512 are positioned so that they reside entirely on insulating layer 1502 (through routing interconnects 1506). Insulating layer 1502 provides stress absorption for the chip of the resulting integrated circuit package with regard to stresses applied to bump interconnect 1512. The second and third approaches described above with respect to FIGS. 9-13 did not perform adequate stress absorption, which could lead to unwanted chip damage. Furthermore, as shown in FIG. 15, bump interconnect 1512a is positioned entirely above insulating layer 1502 without the need for additional layers. The first approach described above with respect to FIGS. 5-8 required two polymer layers, which is a more complicated and expensive technique. Thus, the embodiments described with respect to FIGS. 14-18 provide advantages over the three approaches described in the prior section.

In an embodiment, a separate under bump metallization layer is not required for mounting a bump interconnect, as is required in the three conventional approaches described in the prior section. As shown in FIG. 15, bump interconnect 1512a is attached directly to routing interconnect 1506a. For example, bump interconnect 1512a may be attached to routing interconnect 1506a by soldering (e.g., reflow), etc.

Figure 19:
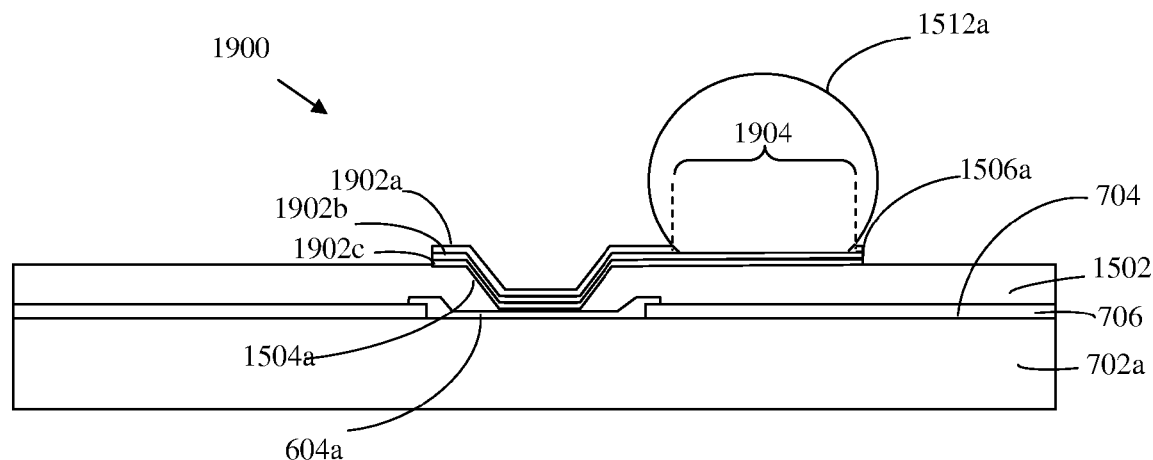
FIGS. 19-23 show cross-sectional views of various integrated circuit regions, according to example embodiments of the present invention.

FIG. 19 shows a cross-sectional view of a portion of an integrated circuit region 1900, according to another embodiment of the present invention. In the embodiment of FIG. 19, routing interconnect 1506a includes a plurality of layers 1902a-1902c. For example, plurality of layers 1902a-1902c is formed of a stack or stack-up of layers of one or more different materials, such as different metals/metal alloys described elsewhere herein. In FIG. 19, outermost layer 1902a of the plurality of layers 1902a-1902c is removed in a region 1904 (using chemical etching, lithography, etc.) where bump interconnect 1512a is connected to routing interconnect 1506a. In FIG. 19, outermost layer 1902a is a material that is not solderable, and bump interconnect 1512a is a solder that does not stick to the material of outermost layer 1902a. However, second layer 1902b is a solderable material to which bump interconnect 1512a can stick. Thus, the material of outermost layer 1902a is removed from routing interconnect 1506 in region 1904 so that bump interconnect 1512a can be attached to second layer 1902b. Furthermore, because outermost layer 1902a is not solderable, and is present on routing interconnect 1506a outside of region 1904, outermost layer 1902a prevents solder of bump interconnect 1512a from wetting toward via 1504a and potentially damaging the chip at terminal 604a.

Figure 20:
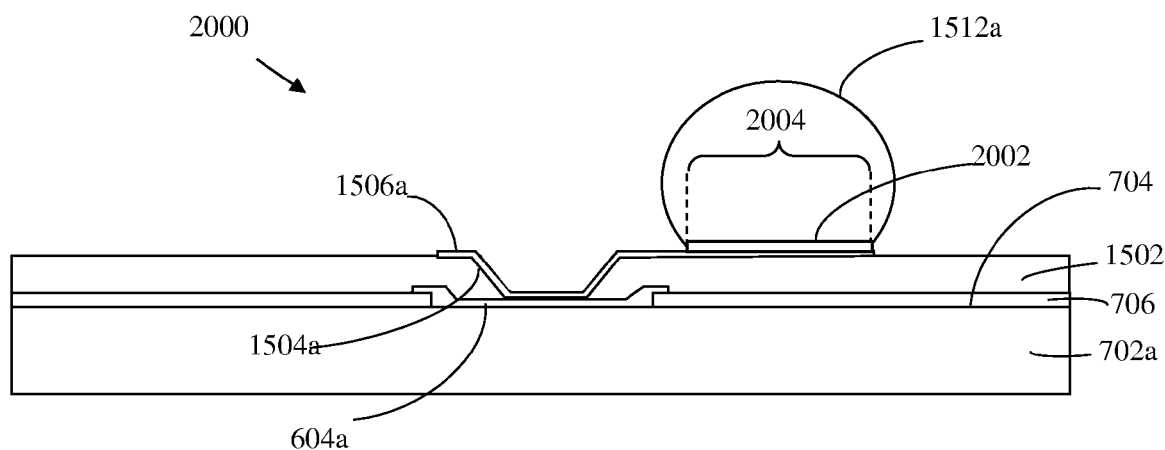

FIG. 20 shows a cross-sectional view of a portion of an integrated circuit region 2000, according to another embodiment of the present invention. In the embodiment of FIG. 20, an additional metal layer 2002 is formed on routing interconnect 1506a in a region 2004. In FIG. 20, bump interconnect 1512a is a solder that does not stick to the material of routing interconnect 1506a, which is not solderable. However, the material of additional metal layer 2002 is solderable, and thus bump interconnect 1512a can stick to additional metal layer 2002. Thus, additional metal layer 2002 is applied as an outermost solderable layer to routing interconnect 1506a in region 2004 so that bump interconnect 1512a can be attached to routing interconnect 1506a through layer 2002. Furthermore, routing interconnect 1506a, which is not solderable, prevents solder of bump interconnect 1512a from wetting toward via 1504a and potentially damaging the chip.

Figure 21:
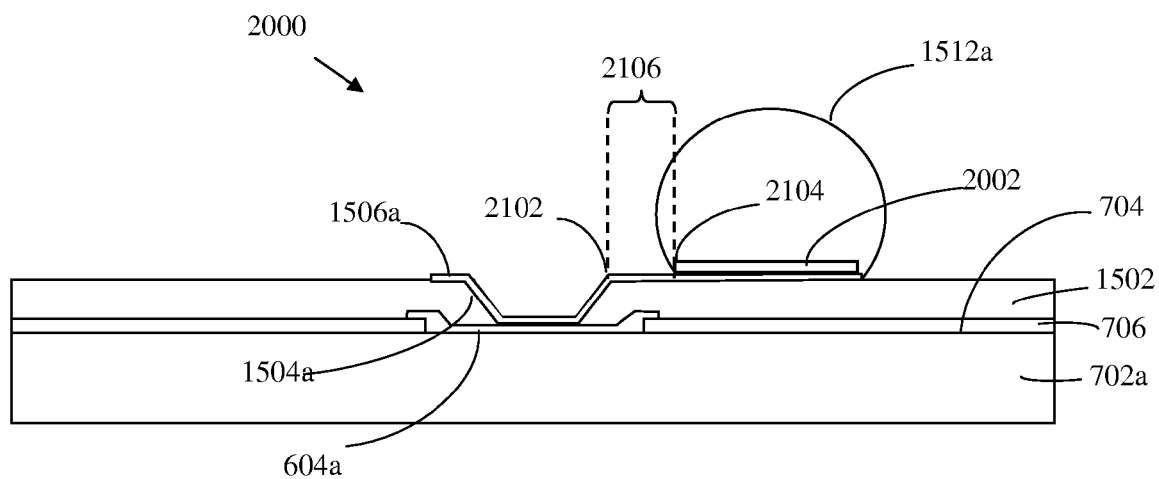

In embodiments, bump interconnects 1512 can be positioned and/or sized in various ways. For example, FIG. 21 shows the cross-sectional view of integrated circuit region 2000 shown in FIG. 20. In FIG. 21, an opening of via 1504a has an edge position 2102 nearest bump interconnect 1512a. Bump interconnect 1512a has a base edge position 2104 nearest via 1504a (e.g., coincident with an edge of additional metal layer 2002, when present). In the embodiment of FIG. 21, bump interconnect 1512a does not overlap via 1504a (e.g., does not overhang via 1504a in FIG. 21). Furthermore, a distance 2106 between via edge position 2102 and bump interconnect base edge position 2104 is greater than zero. Thus, via 1504a and bump interconnect 1512a are spaced apart.

Figure 22:
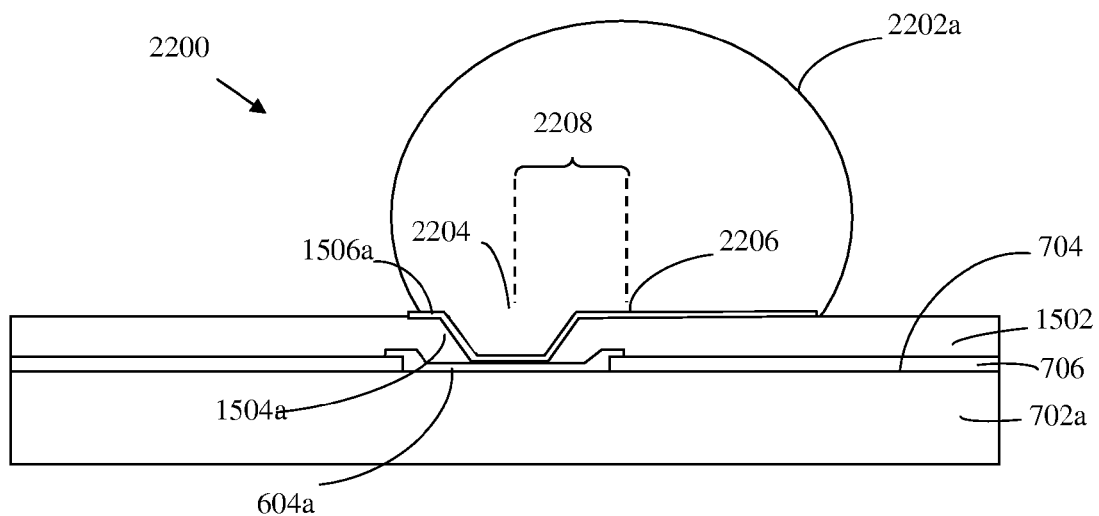

In another embodiment, a via and bump interconnect may be separated by a zero distance, or may even overlap. For example, FIG. 22 shows a cross-sectional view of an integrated circuit region 2200, where a bump interconnect 2202a is attached to routing interconnect 1506a, and overlaps via 1504a. In fact, in FIG. 22, bump interconnect 2202a completely overlaps via 1504a. As shown in FIG. 22, an opening of via 1504a has a center point 2204. A base of bump interconnect 2202a has a center point 2206. Center point 2204 of via 1504a is separated from center point 2206 of the base of bump interconnect 2202a by a distance 2208 that is greater than zero. Thus, in an embodiment, via 1504a and bump interconnect 2202a may be overlapping, but are not co-centered in integrated circuit region 2200, and instead their centers are offset from each other.

Furthermore, when overlapping, a bump interconnect may partially or entirely fill the respective via. For example, in the embodiment of FIG. 22, bump interconnect 2202a fills via 1504a.

Figure 23:
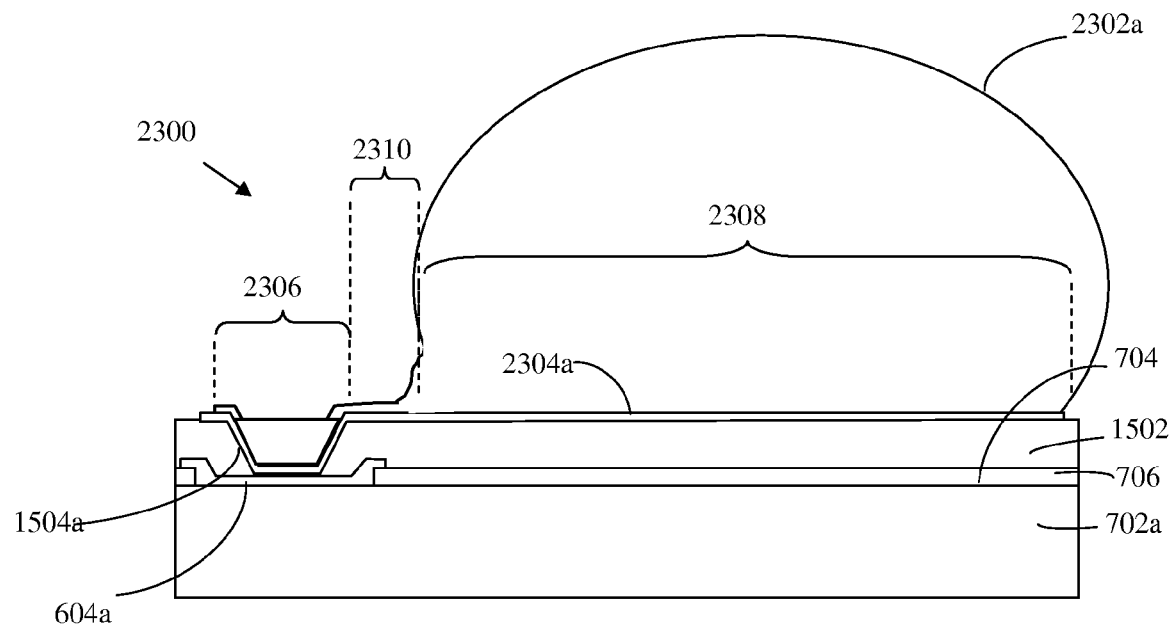

In another embodiment, a via and respective bump interconnect may be separated by a distance, but the routing interconnect may be configured to allow solder to flow from the bump interconnect to the via (such as during solder reflow of the bump interconnect). For example, FIG. 23 shows a cross-sectional view of an integrated circuit region 2300, where a bump interconnect 2302a is attached to routing interconnect 2304a. Bump interconnect 2302a does not overlap with via 1504a in FIG. 23. As shown in FIG. 23, routing interconnect 2304a includes a first portion 2306, a second portion 2308, and a third portion 2310. First portion 2306 is in contact with terminal 604a through via 1504a. First bump interconnect 2302a is connected to second portion 2308. Third portion 2310 is similar to a trace routed on insulating layer 1502, and connects together first and second portions 2306 and 2308. Third portion 2310 is configured to allow solder applied to second portion 2308 of routing interconnect 2304a to flow into via 1504a (e.g., during reflow of bump interconnect 2302a). Thus, third portion 2310 functions as a conduit for solder from second portion 2308 to first portion 2306.

Figure 24:
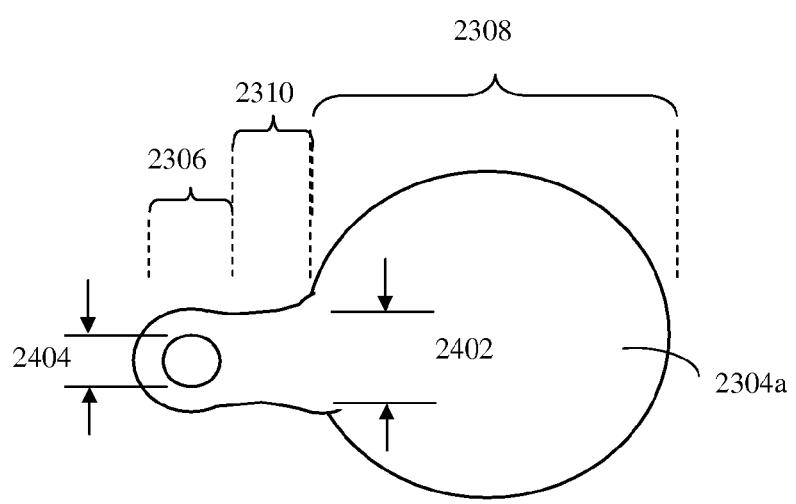
FIGS. 24 and 25 show plan views of example routing interconnects, according to embodiments of the present invention.
Figure 25:
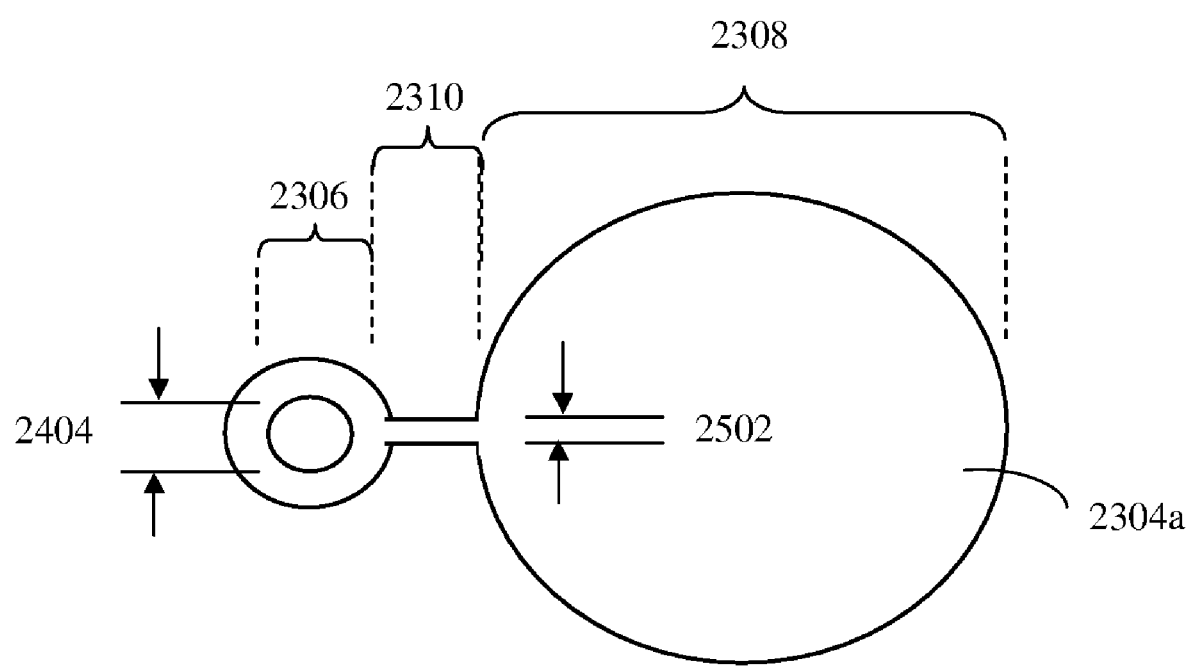

Third portion 2310 can be configured in various ways to control a rate of solder flow from second portion 2308 to first portion 2306. For example, FIGS. 24 and 25 show example embodiments for third portion 2310. FIG. 24 shows a plan view of routing interconnect 2304a, where third portion 2310 has a width 2402 greater than a diameter 2404 of via 1504a. FIG. 25 shows a plan view of an alternative routing interconnect 2304a, where third portion 2310 has a width 2502 less than diameter 2404 of via 1504a. Thus, in the embodiment of FIG. 24, a higher rate of solder flow is enabled because third portion 2310 is wider relative to third portion 2310 in FIG. 25. In FIG. 25, a lower rate of solder flow is enabled because third portion 2310 is narrower relative to third portion 2310 in FIG. 24. The width of third portion 2310 can be increasingly narrowed until solder is essentially prevented from flowing into via 1504a.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) package, comprising:
   an integrated circuit chip having a plurality of terminals configured in an array on a surface of the integrated circuit chip;
   an insulating layer on the surface;
   a plurality of vias through the insulating layer to provide access to the plurality of terminals;
   a plurality of routing interconnects each having a first portion and a second portion, the first portion of each routing interconnect being in contact with a respective terminal of the plurality of terminals through a respective via and the second portion of each routing interconnect extending over the insulating layer; and
   a plurality of bump interconnects, wherein each bump interconnect of the plurality of bump interconnects is connected to the second portion of a respective routing interconnect of the plurality of routing interconnects;
   wherein the first portion of each routing interconnect has a rounded shape that surrounds the respective via on a surface of the insulating layer, and the second portion of each routing interconnect has a rounded shape on the surface of the insulating layer;
   wherein each routing interconnect of the plurality of routing interconnects includes a third portion connected between the first and second portions; and
   wherein a diameter of the first portion is greater than a width of the third portion, and a diameter of the second portion is greater than the width of the third portion.

2. The IC package of claim 1, wherein the second portion of each routing interconnect comprises a stack of a plurality of layers of material, wherein an outermost layer of the plurality of layers of material is removed in a region where a bump interconnect is connected.

3. The IC package of claim 1, wherein the second portion of each routing interconnect includes an outermost solderable layer in a region to which a bump interconnect is connected.

4. The IC package of claim 1, wherein the plurality of routing interconnects includes a first routing interconnect, wherein the first portion of the first routing interconnect is in contact with a respective terminal through a first via, and a first bump interconnect is connected to the second portion of the first routing interconnect, wherein the first via has an edge position nearest the first bump interconnect, and the first bump interconnect has a base edge position nearest the first via, wherein the first bump interconnect does not overlap the first via, and a distance between the first via edge position and the first bump interconnect base edge position is greater than zero.

5. The IC package of claim 1, wherein the plurality of routing interconnects includes a first routing interconnect, wherein the first portion of the first routing interconnect is in contact with a respective terminal through a first via and a first bump interconnect is connected to the second portion of the first routing interconnect, wherein the first bump interconnect overlaps the first via.

6. The IC package of claim 5, wherein an opening of the first via has a center point, and a base of the first bump interconnect has a center point, wherein the center point of the first via is separated from the center point of the base of the first bump interconnect by a distance that is greater than zero.

7. The IC package of claim 5, wherein the first bump interconnect at least partially fills the first via.

8. The IC package of claim 1, wherein the plurality of routing interconnects includes a first routing interconnect, wherein the first portion of the first routing interconnect is in contact with a respective terminal through a first via and a first bump interconnect is connected to the second portion of the first routing interconnect, wherein the first routing interconnect includes a third portion connected between the first and second portions of the first routing interconnect.

9. The IC package of claim 8, wherein the first bump interconnect does not overlap the first via, wherein solder applied to the second portion of the first routing interconnect to form the first bump interconnect uses the third portion of the first routing interconnect as a conduit to at least partially fill the first via.

10. The IC package of claim 8, wherein the third portion of the first routing interconnect has a width less than a diameter of the first via.

11. The IC package of claim 8, wherein the third portion of the first routing interconnect has a width greater than a diameter of the first via.

12. The IC package of claim 1, wherein the insulating layer is a polymer.

13. The IC package of claim 1, wherein the insulating layer absorbs stress between the integrated circuit chip and plurality of bump interconnects.

14. The IC package of claim 1, wherein the first portion of each routing interconnect has a diameter that is less than a diameter of the second portion of each routing interconnect.

15. A wafer level integrated circuit package structure, comprising:
a wafer having a plurality of integrated circuits regions, each integrated circuit region having a plurality of accessible terminals configured in an array on a surface of the wafer;
an insulating layer on the surface of the wafer;
a plurality of vias through the insulating layer that provide access to the plurality of terminals of each integrated circuit region;
a plurality of routing interconnects on the insulating layer, wherein each routing interconnect of the plurality of routing interconnects has a first portion in contact with a respective terminal through a respective via and a second portion that extends over the insulating layer; and
a plurality of bump interconnects on the plurality of routing interconnects, wherein each bump interconnect of the plurality of bump interconnects is connected to the second portion of a respective routing interconnect of the plurality of routing interconnects;
wherein the first portion of each routing interconnect has a rounded shape that surrounds the respective via on a surface of the insulating layer, and the second portion of each routing interconnect has a rounded shape on the surface of the insulating layer;
wherein each routing interconnect of the plurality of routing interconnects includes a third portion connected between the first and second portions; and
wherein a diameter of the first portion is greater than a width of the third portion, and a diameter of the second portion is greater than the width of the third portion.

16. The wafer level integrated circuit package structure of claim 15, wherein the second portion of each routing interconnect comprises a stack of a plurality of layers of material, wherein an outermost layer of the plurality of layers of material is removed in a region where a bump interconnect is connected.

17. The wafer level integrated circuit package structure of claim 15, wherein the second portion of each routing interconnect includes an outermost solderable layer in a region to which a bump interconnect is connected.

18. The wafer level integrated circuit package structure of claim 15, wherein the plurality of routing interconnects includes a first routing interconnect, wherein the first portion of the first routing interconnect is in contact with a respective terminal through a first via, and a first bump interconnect is connected to the second portion of the first routing interconnect, wherein the first via has an edge position nearest the first bump interconnect, and the first bump interconnect has a base edge position nearest the first via, wherein the first bump interconnect does not overlap the first via, and a distance between the first via edge position and the first bump interconnect base edge position is greater than zero.

19. The wafer level integrated circuit package structure of claim 15, wherein the plurality of routing interconnects includes a first routing interconnect, wherein the first portion of the first routing interconnect is in contact with a respective terminal through a first via and a first bump interconnect is connected to the second portion of the first routing interconnect, wherein the first bump interconnect overlaps the first via.

20. The wafer level integrated circuit package structure of claim 15, wherein an opening of the first via has a center point, and a base of the first bump interconnect has a center point, wherein the center point of the first via is separated from the center point of the base of the first bump interconnect by a distance that is greater than zero.

21. The wafer level integrated circuit package structure of claim 15, wherein the plurality of routing interconnects includes a first routing interconnect, wherein the first portion of the first routing interconnect is in contact with a respective terminal through a first via and a first bump interconnect is connected to the second portion of the first routing interconnect, wherein the first routing interconnect includes a third portion connected between the first and second portions of the first routing interconnect.

22. The wafer level integrated circuit package structure of claim 21, wherein the first bump interconnect does not overlap the first via, wherein the third portion of the first routing interconnect is configured as a conduit to enable solder of the first bump interconnect to at least partially fill the first via.

23. The wafer level integrated circuit package structure of claim 21, wherein the third portion of the first routing interconnect has a width less than a diameter of the first via.

24. The wafer level integrated circuit package structure of claim 21, wherein the third portion of the first routing interconnect has a width greater than a diameter of the first via.

25. The wafer level integrated circuit package structure of claim 15, wherein the first portion of each routing interconnect has a diameter that is less than a diameter of the second portion of each routing interconnect.

* * * * *